US010412830B2

(12) United States Patent
Labie et al.

(10) Patent No.: US 10,412,830 B2
(45) Date of Patent: Sep. 10, 2019

(54) SYSTEM INCLUDING A CONDUCTIVE TEXTILE AND AN ELECTRONIC CIRCUIT UNIT AND A METHOD

(71) Applicant: IMEC VZW, Leuven (BE)

(72) Inventors: Riet Labie, Leuven (BE); Frederic Duflos, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/898,986

(22) Filed: Feb. 19, 2018

(65) Prior Publication Data

US 2018/0242449 A1     Aug. 23, 2018

(30) Foreign Application Priority Data

Feb. 20, 2017 (EP) .................................... 17156976

(51) Int. Cl.
*H05K 1/00* (2006.01)
*H05K 1/03* (2006.01)
(Continued)

(52) U.S. Cl.
CPC ............. *H05K 1/038* (2013.01); *H01R 12/62* (2013.01); *H01R 43/205* (2013.01); *H05K 1/115* (2013.01);
(Continued)

(58) Field of Classification Search
CPC ........ H01R 12/50; H05K 1/038; H05K 1/115; H05K 1/141; H05K 2201/0281;
(Continued)

(56) References Cited

U.S. PATENT DOCUMENTS

2003/0212319 A1   11/2003   Magill
2005/0235482 A1   10/2005   Deaett et al.
(Continued)

FOREIGN PATENT DOCUMENTS

DE       10001180      *   7/2000
DE       10001180 A1       7/2000
(Continued)

OTHER PUBLICATIONS

Satomi et al., "Hard/Soft Connections", Interface Cultures.
(Continued)

*Primary Examiner* — Yuriy Semenenko
(74) *Attorney, Agent, or Firm* — Moser Taboada

(57) ABSTRACT

According to an aspect of the present inventive concept there is provided a system comprising:
  a conductive textile including conductive fibers,
  an electronic circuit unit arranged on a first main surface of the conductive textile and including circuitry and a carrier supporting the circuitry, the carrier having a first main surface and a second main surface facing the first main surface of the textile and including a through-hole extending from the first main surface to the second main surface,
  a conductive pin including an leg segment arranged at least partly in the through-hole, and a grip segment arranged to grip about at least one fiber of the conductive textile.
There is also provided a method for mounting an electronic circuit unit on a conductive textile.

12 Claims, 4 Drawing Sheets

(51) Int. Cl.
  *H05K 1/11* (2006.01)
  *H05K 3/30* (2006.01)
  *H01R 43/20* (2006.01)
  *H05K 3/32* (2006.01)
  *H01R 12/62* (2011.01)
  *H05K 1/14* (2006.01)
  *H05K 3/00* (2006.01)
  *H05K 3/40* (2006.01)

(52) U.S. Cl.
  CPC ............ *H05K 3/301* (2013.01); *H05K 3/325* (2013.01); *H05K 1/141* (2013.01); *H05K 3/0058* (2013.01); *H05K 3/4046* (2013.01); *H05K 2201/029* (2013.01); *H05K 2201/0281* (2013.01); *H05K 2201/0305* (2013.01); *H05K 2201/10287* (2013.01); *H05K 2201/10295* (2013.01)

(58) Field of Classification Search
  CPC ..... H05K 2201/029; H05K 2201/0305; H05K 2201/10287; H05K 2201/10295; H05K 3/0058; H05K 3/301; H05K 3/325; H05K 3/4046
  See application file for complete search history.

(56) References Cited

U.S. PATENT DOCUMENTS

| | | |
|---|---|---|
| 2010/0039269 A1 | 2/2010 | Newham |
| 2010/0238637 A1 | 9/2010 | Bhattacharya et al. |
| 2011/0226515 A1 | 9/2011 | Son et al. |
| 2012/0020044 A1* | 1/2012 | Iihola .................. H01L 21/4828 361/783 |
| 2012/0052268 A1 | 3/2012 | Axisa et al. |
| 2014/0124237 A1* | 5/2014 | Demers .................. B32B 37/20 174/115 |
| 2016/0270223 A1* | 9/2016 | Cherenack ........... H05K 1/0283 |
| 2017/0017265 A1* | 1/2017 | Vacas Jacques ..... A61B 5/6805 |
| 2017/0086513 A1* | 3/2017 | Maxey ............... A41D 13/0051 |
| 2017/0156640 A1* | 6/2017 | Robucci ................. A61B 5/1118 |

FOREIGN PATENT DOCUMENTS

| | | |
|---|---|---|
| DE | 102011075034 A1 | 10/2012 |
| EP | 3035779 | * 6/2016 |
| EP | 3035779 A1 | 6/2016 |

OTHER PUBLICATIONS

Satomi et al., "LilyPad SnapRing", Interface Cultures.

Labie et al., "Overzicht contactmethoden voor integratie van elektronische modules op textile", Smart Textiles and Wearable Intelligence, pp. 1-28, 2015.

Extended European Search Report dated Aug. 29, 2017 for Application No. 17156976.7.

* cited by examiner

SYSTEM INCLUDING A CONDUCTIVE TEXTILE AND AN ELECTRONIC CIRCUIT UNIT AND A METHOD

CROSS-REFERENCE TO RELATED APPLICATIONS

This application claims priority to and the benefit of European Patent Application No. 17156976.7, filed on Feb. 20, 2017, the disclosure of which is incorporated herein by reference in its entirety.

TECHNICAL FIELD

The present inventive concept relates to a system including a conductive textile and an electronic circuit unit and a method for mounting an electronic circuit unit on a conductive textile.

BACKGROUND

There is an increasing interest in combining or integrating electronics with textiles to form "smart textiles". Fields of applications include sensors for monitoring heart rate, bio-impedance or skin resistance; motion sensors such as accelerometers; temperature sensing; to name a few. Other applications input devices for controlling computing devices such as smart phones, tablets, computers etc. Such smart textiles may find use in professional, medical as well as consumer applications. Such smart textiles may be implemented in various products such as wearables or clothing, to name a few examples.

A textile may itself include conductive fibers or yarns wherein the textile may be arranged as a conductive textile, in a portion or portions thereof or along the entire surface of the textile. This allows the textile to be electrically connected to and form part of the circuitry of electronic devices. It however remains challenging to combine and connect electronic circuits and conductive textiles.

SUMMARY

An objective of the present inventive concept is to address this challenge. Further and alternative objectives may be understood from the following.

According to a first aspect of the present inventive concept there is provided a system comprising:

a conductive textile including conductive fibers, an electronic circuit unit arranged on a first main surface of the conductive textile and including circuitry and a carrier supporting the circuitry, the carrier having a first main surface and a second main surface facing the first main surface of the textile and including a through-hole extending from the first main surface of the carrier to the second main surface of the carrier, a conductive pin including a leg segment arranged at least partly in the through-hole, and a grip segment arranged to grip about at least one fiber of the conductive textile.

The inventive system enables an electronic circuit unit and a conductive textile to be reliably interconnected, both mechanically and electrically.

The provision of the grip segment enables the conductive pin to reliably engage one or more fibers of the textile in a hooking manner, thereby preventing or at least reducing the risk of accidental extraction of the conductive pin from the textile.

The pin, by being conductive, enables a galvanic connection to be formed between conductive fibers of the textile and circuitry of the electronic circuit unit.

Advantageously, a galvanic connection may be formed between the textile and an electrical contact portion on the carrier via the conductive pin. The electrical contact portion may further be connected to the circuitry.

Arranging the leg segment in the through-hole of the carrier facilitates manufacture since assembly may be made by conventional electronic assembly tools for mounting through-hole components, without requiring substantial modifications of the tools.

Arranging the leg segment in the through-hole of the carrier facilitates a reliable mechanical attachment between the pin and the electronic circuit unit. The through-hole provides a sidewall surface (which may be provided with the electrical contact portion) to which a load can be transferred, and also an edge portion about which the conductive pin can be adapted to grip. The through-hole further provides a space for receiving a filler such as an adhesive or solder, which further may facilitate achieving a good electrical contact and a strong mechanical attachment of the pin to the electronic circuit unit.

Arranging the leg segment in the through-hole of the carrier also improves the flexibility of the system. Connection of the pin to the circuitry is facilitated regardless of whether the circuitry is arranged on the first or second main surface of the carrier.

By "conductive textile" is hereby meant a textile including electrically conductive fibers. The conductive textile may be a woven or non-woven textile, a knitted textile or a braided textile. More generally, the textile may be any textile providing apertures or loops with which the conductive pin may engage.

The conductive textile may include a combination of non-conductive fibers and conductive fibers. The conductive textile may include a non-conductive textile formed by woven, non-woven, knitted or braided non-conductive fibers, and conductive fibers arranged on or integrated in the non-conductive textile. The conductive fibers may be woven, knitted, braided or sewed/stitched into the non-conductive textile. The conductive fibers may be arranged on or integrated in the non-conductive textile from one or both sides of the non-conductive textile.

The grip segment may grip about a set of fibers, said set of fibers including at least one non-conductive fibers and/or at least one conductive fiber. Preferably, the grip segment grips about at least one conductive fiber of the conductive textile The conductive pin may be attached to the carrier of the electronic circuit unit. Especially, the leg segment of the conductive pin may be fixedly arranged in the through-hole of the carrier. Various manners of fixing the leg segment, and thus the conductive pin, in relation to the carrier are possible such as by press-fitting leg segments of the conductive pin in the through-hole, by arranging the leg segment to grip about an edge of the through-hole and/or by fixing the leg segment in the through-hole using an adhesive or solder. Various embodiments are further set out below.

By electronic circuit unit is hereby meant a combination including electronic circuitry and a carrier. The circuitry may include digital and/or analog circuitry. The circuitry may implement various functionality such as sensor functionality, input device functionality etc.

The circuitry may include circuitry (portions) arranged on the first main surface of the carrier and/or the second main surface of the carrier.

The electronic circuit unit is advantageously provided in the form of a printed circuit board (PCB). The carrier may be a non-conductive substrate.

By the electronic circuit unit being arranged "on" a first main surface of the conductive textile is hereby meant that the electronic circuit unit may be arranged directly on the first main surface of the conductive textile, i.e. in abutment with the first main surface of the conductive textile, or that the electronic circuit unit may be arranged on the first main surface of the conductive textile, with one or more structures or elements in between the electronic circuit unit and the conductive textile. For instance, an adhesive layer, or a textile other than the conductive textile, may be provided between the second main surface of the carrier of the electronic circuit unit and the first main surface of the conductive textile. The electronic circuit unit need hence not be arranged in direct contact, i.e. in abutment, with the conductive textile.

The leg segment and the grip segment refer to respective parts, that is a leg part and a grip part, of the conductive pin.

The leg segment represents a part of the conductive pin having a first portion, a second portion and a mid-portion extending between the first portion and the second portion. The second portion is connected to the grip segment.

The grip segment represents a part of the conductive pin having a first portion, a second portion and a mid-portion extending between the first portion and the second portion. The first portion is connected to the leg segment.

In the present disclosure, the term "end portion" may be used to refer to a portion where a segment of the conductive pin, such as the leg segment, either is connected or transitions to another segment of the conductive pin, such as the grip segment; or terminates to form a free end portion of the conductive pin.

Accordingly, the first portion of the leg segment/grip segment may be referred to as a first end portion of the leg segment/grip segment. The second portion of the leg segment/grip segment may be referred to as a second end portion of the leg segment/grip segment.

The first portion of the leg segment may be a free end portion of the conductive pin.

The mid-portion may be elongated, wherein the leg segment forms an elongated leg segment. The mid-portion may define a longitudinal direction of the leg segment.

The grip segment of the conductive pin may have a first (end) portion connecting to the leg segment and a second (end) portion extending towards the carrier. The grip segment may thereby grip about the fibers.

The second portion of the grip segment may extend towards the electronic circuit in a direction having a major component in parallel with a longitudinal direction of the leg segment of the conductive pin.

The grip segment may present a curved mid-portion extending between the first portion and the second portion. The portion may facilitate arranging the grip segment to engage with the fibers. Also, abrupt bends in the grip segment may be avoided.

The second (end) portion of the grip segment may form a free end of the grip segment. This enables a conductive pin shaped approximately as a "J".

A "J-shaped" conductive pin enables the conductive pin to be inserted through the textile first and then into the through-hole with the leg segment first. A "J-shaped" conductive pin may accordingly be assembled with the carrier of the electronic circuit unit from a second main surface of the textile, which second main surface is facing away from the carrier.

A "J-shaped" conductive pin also enables the conductive pin to first be inserted, with the grip segment first, into the through-hole in a direction from the first main surface (of the carrier) and inserting the grip segment into the textile and bringing the second leg portion back towards, and optionally into, the through-hole. A "J-shaped" conductive pin may accordingly be assembled with the electronic circuit unit using a technique resembling crocheting.

The second portion may extend into the through-hole. A more reliable mechanical and electrical coupling between the electronic circuit unit and the textile is thereby enabled.

A J-shaped pin thus allows assembly and connection with the electronic circuit unit from either the textile- or the carrier-side. Insertion from the carrier-side may facilitate the alignment of the pin positioning.

Advantageously, a radius of curvature of the curved portion of the grip segment may be in the range of 10 μm to 500 μm. A radius of curvature in this range enables gripping about fibers of dimensions typically used in textiles. A radius of curvature in this range also allows the grip segment to pass through, or fit within, through-hole vias with dimensions used in typical PCBs.

According to one embodiment the leg segment forms a first leg segment and the conductive pin includes a second leg segment arranged at least partly in the through-hole, wherein the grip segment extends between and connects the first leg segment and the second leg segment. This enables a conductive pin shaped approximately as a "U".

A "U-shaped" conductive pin enables the conductive pin to be inserted through the textile and into the through-hole with the first and second leg segments first. A "U-shaped" conductive pin may accordingly be assembled with the electronic circuit unit from the side of the textile facing away from the carrier.

By both the first and the second leg segments being arranged at least partly in the through-hole, a more reliable mechanical and electrical coupling between the electronic circuit unit and the textile is enabled.

The second leg segment may be similarly arranged as the first leg segment. The second leg segment accordingly represents a part of the conductive pin having a first portion, a second portion and a mid-portion extending between the first portion and the second portion. The first portion is connected to the grip segment. The second portion may be a free end portion of the conductive pin.

The grip segment connecting the first and the second leg segments may include a curved portion. A radius of curvature of the curved portion of the grip segment may be in the range of 10 μm to 500 μm. A radius of curvature in this range enables gripping about fibers of dimensions typically used in textiles. A radius of curvature in this range also allows the grip segment to pass through, or fit within, through-hole vias with dimensions used in typical PCBs.

The conductive pin may be resiliently deformable and press-fitted into the through hole. Accordingly, the conductive pin may be so arranged that a separation between the first leg segment and the second leg segment, in a non-deformed or released configuration of the conductive pin, is greater than the width or diameter of the through-hole.

According to one embodiment, at least a portion of the grip segment is in galvanic contact with a conductive fiber of the textile. Advantageously, a curved mid-portion of the grip segment is in galvanic contact with a conductive fiber of the textile.

Alternatively or additionally a portion of the (first and/or second) leg segment may be in galvanic contact with a conductive fiber of the textile.

According to one embodiment the electronic circuit unit includes a contact portion arranged on the carrier and the conductive pin is in galvanic contact with the contact portion. An electrical connection between the conductive textile and the circuitry is thereby provided.

The contact portion may be arranged on a sidewall surface of the through-hole. The contact portion may be formed by a plating arranged on the side wall surface of the through-hole. Hence a conventional plated through-hole via in the carrier may be used for enabling the assembly.

The through-hole may be at least partially filled with a conductive material. A strong mechanical coupling between the conductive pin and the electronic circuit unit may thus be achieved. The conductive material may further enable forming of a low-resistance galvanic connection with the leg segment of the conductive pin.

According to one embodiment the leg segment has a wing portion curved to extend along the first main surface of the carrier. The wing portion of the leg segment may thus grip about an edge portion of the through-hole. The wing portion may be formed at the first portion of the leg segment. In case the conductive pin includes the afore-mentioned first and second leg segments, a thusly formed wing portion may be arranged on each of the leg segments.

According to one embodiment the system further comprises a wearable including the conductive textile. The conductive textile may in particular form part of the wearable.

According to a second aspect of the present inventive concept, there is provided a method for mounting an electronic circuit unit on a conductive textile including conductive fibers, the method comprising:

arranging the electronic circuit unit on a first main surface of the conductive textile, the electronic circuit unit including circuitry and a carrier supporting the circuitry, the carrier having first and second main surfaces and including a through-hole extending from the first main surface to the second main surface, and inserting a leg segment of a conductive pin into the through-hole and arranging a grip segment of the conductive pin to grip about fibers of the textile.

This aspect may generally present the same or corresponding advantages as the former aspect. Accordingly, the inventive method enables an electronic circuit unit and a conductive textile to be assembled with each other by being reliably interconnected, both mechanically and electrically. The further details and discussion relating to the first aspect applies correspondingly to the method aspect wherefore reference is made to the above.

According to one embodiment the leg segment has a first portion and a second portion, the second portion of the leg segment being connected to the grip segment, and the method comprises inserting the leg segment with the first portion first from a second main surface of the textile and into the through-hole from the second main surface of the carrier. The conductive pin may accordingly be assembled with the electronic circuit unit from the side of the textile facing away from the carrier.

The leg segment may be inserted into the through-hole to such an extent that the grip segment grips about the fibers of the textile from the second main surface of the textile. A reliable mechanical and electrical connection between the fibers and the conductive pin may thereby be obtained.

According to one embodiment the grip segment has a first portion connecting to the leg segment and a second portion extending towards the carrier, the second portion forming a free end of the grip segment, and the method comprises: inserting the conductive pin, with the grip segment first, into the through-hole and (subsequently) into the textile. The grip segment may thereby be arranged to grip about fibers of the textile. The conductive pin, which may be approximately "J-shaped", may accordingly be assembled with the electronic circuit unit from the side of the first main surface of the carrier.

The assembly-technique may resemble a crocheting. The method may further comprise subsequently pulling the fibers of the textile towards the carrier by pulling the grip segment towards the through-hole. The textiles may even be pulled into an opening part of the through-hole. The grip segment may be pulled to such an extent that the second free end portion thereof extends into the through-hole.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

DETAILED DESCRIPTION

Figure 1A:
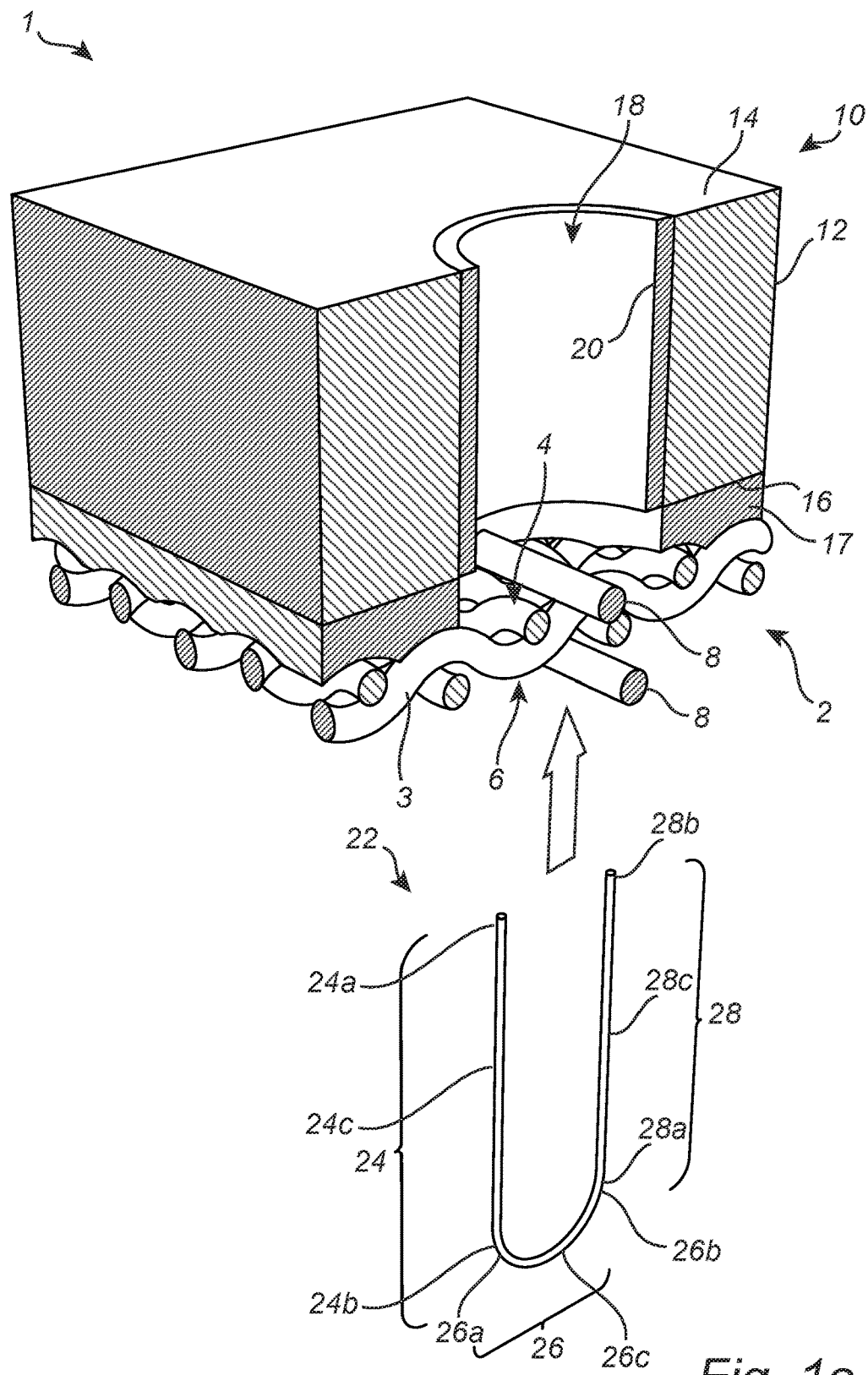
FIGS. 1a-c illustrates a system including a conductive textile, an electronic circuit unit and a conductive pin.

FIG. 1a illustrates a system 1 including a conductive textile 2, an electronic circuit unit 10 and a conductive pin 22. In FIG. 1a the conductive pin 22 is about to be assembled with the conductive textile 2 and the electronic circuit unit 10. FIG. 1a shows in perspective the textile 2 and the electronic circuit unit 10 with a section taken to extend through fibers 3, 8 of the conductive textile 2 and a carrier 12 of the electronic circuit unit 10.

The conductive textile 2 (hereinafter referred to as the textile 2) has a first main surface 4 and an opposite second main surface 6. The textile 2 includes a set of non-conductive fibers 3. The fibers 3 may be woven, knitted or braided together to form a non-conductive textile portion. For simplicity a single layer of non-conductive fibers 3 is shown however the textile 2 may also be a multi-layered textile including a plurality of interwoven layers.

The textile 2 includes a set of conductive fibers 8. The fibers 8 are incorporated into the non-conductive textile portion. Fibers 8 are arranged on both sides of the textile 2. In FIG. 1a, two conductive fibers 8 are indicated however this merely represents an illustrative example and the textile 2 may typically include a plurality of conductive fibers. It should also be noted that although the indicated conductive fibers 8 extend in parallel to each other the conductive fibers 8 may also be arranged in a crisscross pattern. Furthermore, although FIG. 1a illustrates a two-sided arrangement of the conductive fibers 8 with respect to the textile 2, conductive fibers 8 may instead be arranged on only a single side of the textile 2.

The conductive textile may form part of a wearable or a technical textile. The wearable may be a clothing, for instance, a sock, a pair of trousers, underwear, a skirt, a dress, shorts, a shirt (e.g. a T-shirt, sweatshirt, a dress shirt, a sleeveless shirt etc.), a jacket, a coat, a hat, a cap, a scarf, a glove, a shoe, a wrist band, or some other attire. The conductive textile may also form part of a bandage; furniture such as sofas or chairs; beds, pillows, blankets, or linen or carpet; in car seats etc.

The electronic circuit unit 10 is provided in the form of a printed circuit board (PCB). The electronic circuit unit 10 is arranged on the first main surface 4 of the textile 2. The electronic circuit unit 10 includes a carrier 12. The carrier 12 has a first main surface 14 and a second main surface 16. The carrier 12 is arranged with the second surface 16 facing the first main surface 4 of the textile 2. The carrier 12 includes a non-conductive substrate, for instance of FR4 or polyimide, some other glass or epoxy material, or some other dielectric material.

The electronic circuit unit 10 includes circuitry (not shown) supported by the carrier 12. The electronic circuit unit 10 may be a single-sided populated PCB wherein the circuitry may be arranged on the first main surface 14 or the second main surface 16 of the carrier 12. The electronic circuit unit 10 may also be a double-sided populated PCB wherein the circuitry may include respective circuitry portions arranged on the first main surface 14 and the second main surface 16 of the carrier 12. The electronic circuit unit 10 may even be a multi-layered PCB wherein the circuitry may include respective circuitry portions arranged on the first main surface 14 and the second main surface 16 of the carrier 12, as well as one or more circuitry portion layers between the first and second main surfaces 14, 16.

The electronic circuit unit may include circuitry implementing various functionality such as sensors for monitoring heart rate, bio-impedance or skin resistance; motion sensors such as accelerometers; temperature sensing; to name a few. Other applications input devices for controlling computing devices such as smart phones, tablets, computers etc.

The carrier 12 includes a through-hole 18 extending from the first main surface 14 to the second main surface 16. The through-hole 18 is a plated through-hole of the carrier 12, the plating forming an electrical contact portion 20 for the conductive pin 22, as will be further described below. In FIG. 1a, the contact portion 20 is confined to the sidewall surface of the through-hole 18. However, the contact portion 20 may extend beyond the side wall surface to cover also portions of the first and/or second main surface 14, 16 of the carrier 12. The contact portion 20 may in turn be connected to conductive paths of the circuitry, thereby electrically forming part of the circuitry.

As shown, an adhesive 17 may be provided between the textile 2 and the carrier 12 to facilitate handling of the textile 2 and the electronic circuit unit 10 prior to mounting the conductive pin 22, and/or to enable an even more reliable mechanical coupling between the textile 2 and the electronic circuit unit 10.

Although not shown, a cover, housing or other protective coating layer may be arranged over the carrier 12 and the circuitry of the electronic circuit unit 10.

The conductive pin 22 has an approximately "U-shaped" design. The conductive pin 22 includes a first leg segment 24, a grip segment 26 and a second leg segment 28. The first leg segment 24, the grip segment 26 and the second leg segment 28 are integrally formed and together form a continuous conductive pin 22. The conductive pin 22 may be formed by bending a straight pin into the illustrated U-shape. The conductive pin 22 may be formed by a metal or an alloy of metals, for instance Cu or Al, or alloys such as brass and bronze, stainless steel. The pin 22 may be finished with a surface layer such as Cu plated steel, Sn finished Cu, or the like.

The first leg segment 24 is adapted to be arranged, at least partly, in the through-hole 18. The first leg segment 24 represents a part of the conductive pin 22 having a first portion 24a, a second portion 24b and a mid-portion 24c extending between the first portion 24a and the second portion 24b. The mid-portion 24c is elongated and defines a longitudinal direction of the first leg segment 24. The first portion 24a forms a free end of the conductive pin 22. The second portion 24b is connected to a grip segment 26 of the conductive pin 22.

The grip segment 26 represents a part of the conductive pin 22 having a first portion 26a, a second portion 26b and a mid-portion 26c extending between the first portion 26a and the second portion 26b. The first portion 26a is connected to the second portion 24b of the first leg segment 24. The mid-portion 26c has a curved shape and is adapted to grip about the fibers 3, 8 of the textile 2, as will be further described below. The second portion 26b is connected to a second leg segment 28 of the conductive pin 22.

The second leg segment 28 represents a part of the conductive pin 22 having a first portion 28a, a second portion 28b and a mid-portion 28c extending between the first portion 28a and the second portion 28b. The mid-portion 28c is elongated and defines a longitudinal direction of the second leg segment 28. The first portion 28a is connected to the second portion 26b of the grip segment 26. The second portion 28b forms a free end of the conductive pin 22.

The conductive pin 22 is adapted to be combined with the textile 2 and the electronic circuit unit 10. The arrow indicates the direction of insertion of the U-shaped conductive pin 22. The first and second leg segments 24, 28 are accordingly to be inserted with the first portion 24a and the second portion 28b first, from the second main surface 6 of the textile 2 and then into the through-hole 18 from the second main surface 16 of the carrier 12.

Figure 1B:
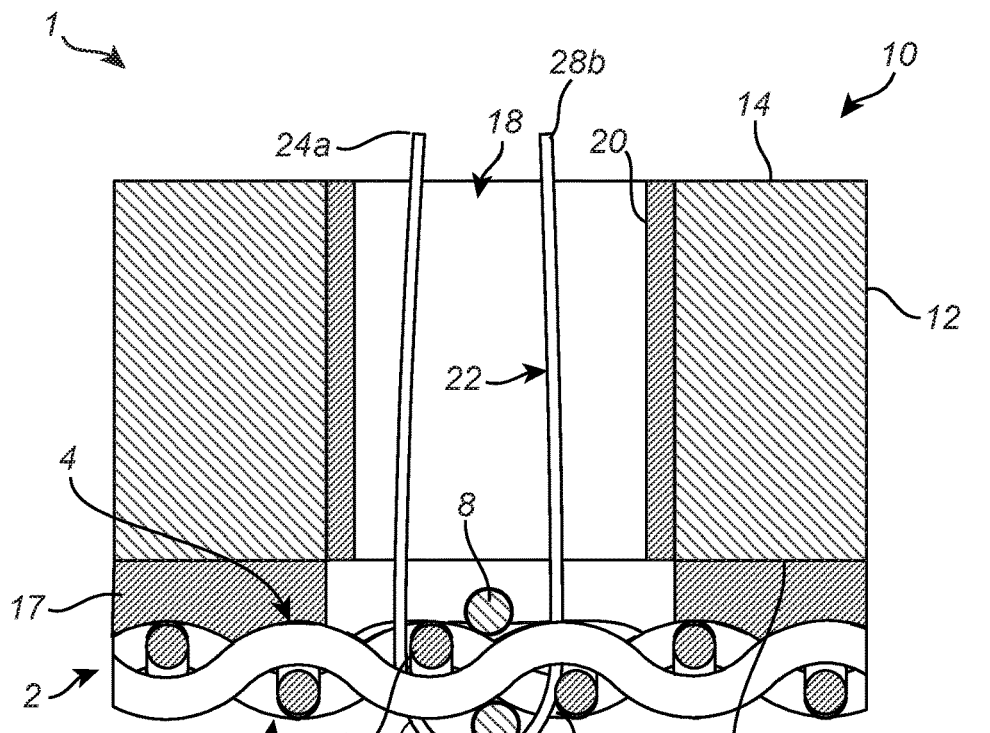

FIG. 1b illustrates the system 1 following insertion of the conductive pin 22 through the textile 2 and into the through-hole 18. The first leg segment 24 and the second leg segment 28 extend inside the through-hole. In FIG. 1b, the first and the second leg segments 24, 28 extend completely through the through-hole such that the first free end 24a and the second free end 28b extend above the first main surface 14 of the carrier 12. The first and the second leg segments 24, 28 may however also be of shorter lengths such that they terminate inside the through-hole.

As shown in FIG. 1b, wherein the first and the second leg segments, 24, 28 are inserted into the through-hole 18 to such an extent that the grip segment 26 grips about the fibers 3, 8 of the textile 2, from the second main surface 6 of the textile 2. A portion of the grip segment 26 is thus brought in galvanic contact with at least one conductive fiber 8 of the textile 2.

The grip segment 26 grips about fibers, or about a bundle of fibers, in the sense that it extends partly about a (bundle of) fibers, in a circumferential direction with respect to the fibers. The grip segment 26 may as shown bear against a circumferential portion of one or more fibers of the textile 2.

A radius of curvature of the curved portion may be in the range of 10 μm up to 500 μm or more, to allow gripping about one or more fibers of the textile 2.

The first portion 26a and the second portion 26b of the grip segment 26 each extends in a direction having a major component in parallel with the longitudinal direction of the first/second leg segment 24/28. In other words, the first portion 26a (and the second portion 26b) accordingly extends towards the carrier 12 at an angle, with respect to the second surface 16 of the carrier 12, which is 45 to 90 degrees.

In FIG. 1b, the separation between the first leg segment 24 and the second leg segment 28, as viewed in a direction transverse to the longitudinal directions of the leg segments, is smaller than the width dimension or diameter of the through hole 18. The diameter of the through-hole may be in the order of one to several hundreds of μm, such as 100-1000 μm.

According to a variation the conductive pin 22 may be so arranged that the separation between the first leg segment 24 and the second leg segment 28, at least along a portion of their respective lengths, is greater than the width or diameter of the through-hole, wherein the conductive pin 22 may be press-fitted into the through-hole. The first and second leg segments 24, 28 may be resiliently deformed by being pressed towards each other to reduce their relative separation such that the first and the second leg portions 24, 28 can be accommodated within the through-hole. After being inserted into the throughout-hole, the pressing force against the first and second leg segments 24, 28 may be released. The first and second leg segments 24, 28 may thereby be allowed to expand to press against the sidewall of the through-hole 18. The first and second leg segments may accordingly engage directly with the contact portion 20.

Figure 1C:
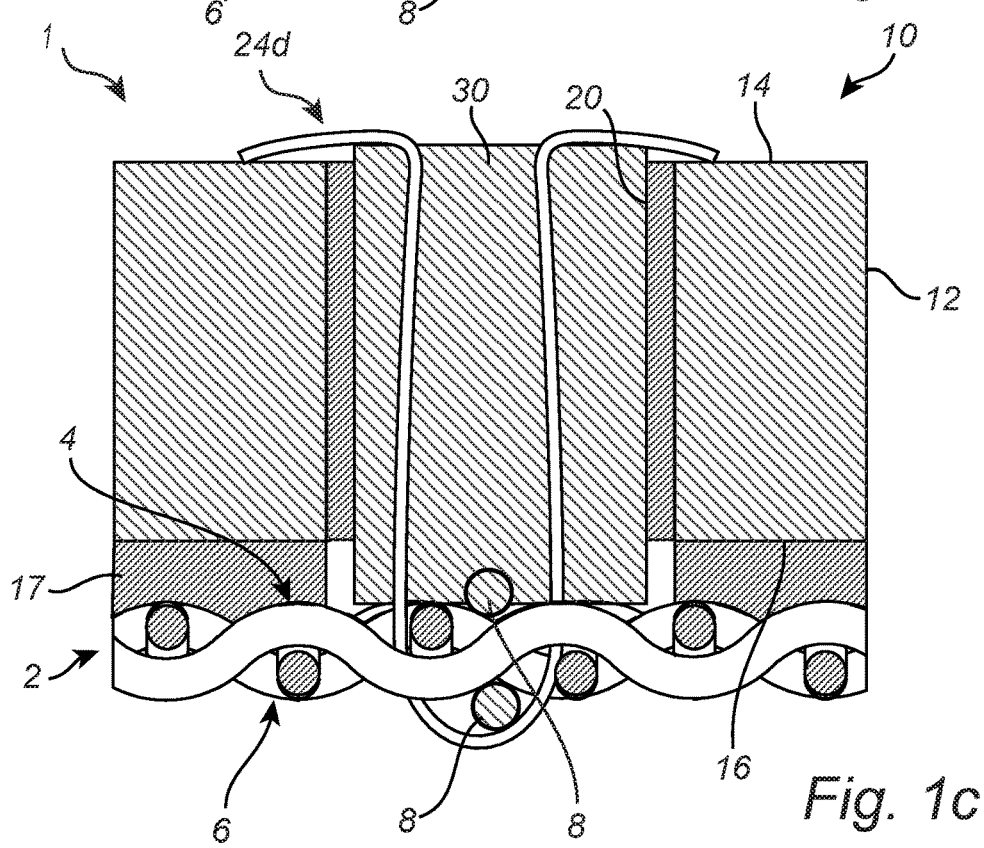

In FIG. 1c, the through-hole 18 has been filled with a conductive material 30. The conductive material 30 may fill the through-hole 18 partially or completely, or even overflow the through-hole 18. The conductive material 30 may fill a space between the parts of the conductive pin arranged in the through-hole 18 and the sidewall of the through-hole 18. The conductive material 30 may include a solder or a conductive adhesive.

As shown in FIG. 1c, the first leg segment 24 is, at the first portion 24a, adapted to present a wing portion 24d curved to extend along the first main surface 14 of the carrier 12. The wing portion of the leg segment may thus grip about an edge portion of the through-hole 18. The wing portion 24d may be formed by bending the protruding first end portion 24a of the first leg segment 24 following insertion into the through-hole 18. The second leg segment 28 may as shown be similarly shaped.

Figure 2:
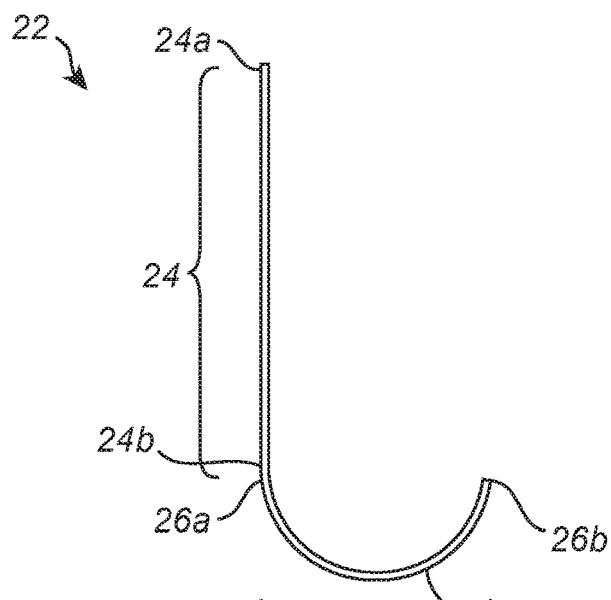
FIGS. 2-4 show variations of a conductive pin.

FIG. 2 illustrates a variant of a conductive pin 22. The conductive pin 22 has an approximately "J-shaped" design. The conductive pin 22 includes a first leg segment 24, a grip segment 26 and a second leg segment 28. The conductive pin 22 is similar to the U-shaped pin shown in FIGS. 1-c however differs by not including a part corresponding to the second leg segment 28. Accordingly, the second portion 26b of the grip segment 26 forms a free end of the conductive pin. The conductive pin 22 of FIG. 2 may be inserted into the textile 2 and the through-hole 18 in a same manner as the U-shaped pin of FIGS. 1a-c, that is with the first portion 24a first, from the second main surface 6 of the textile 2.

Figure 3A:
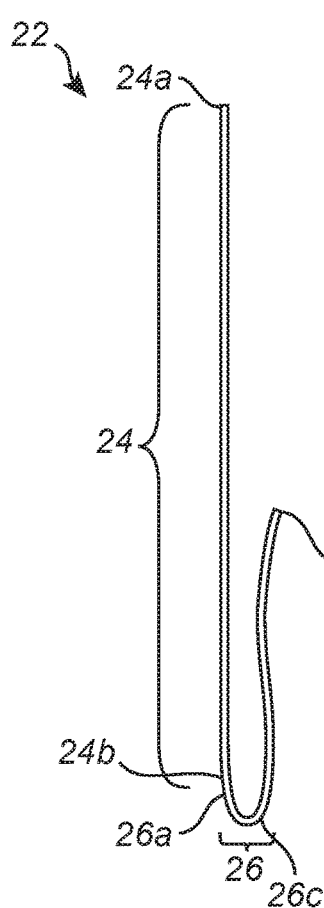
Figure 3B:
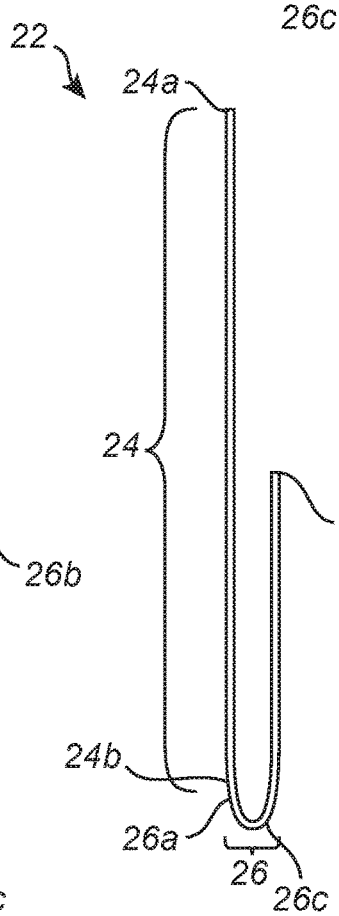
Figure 3C:
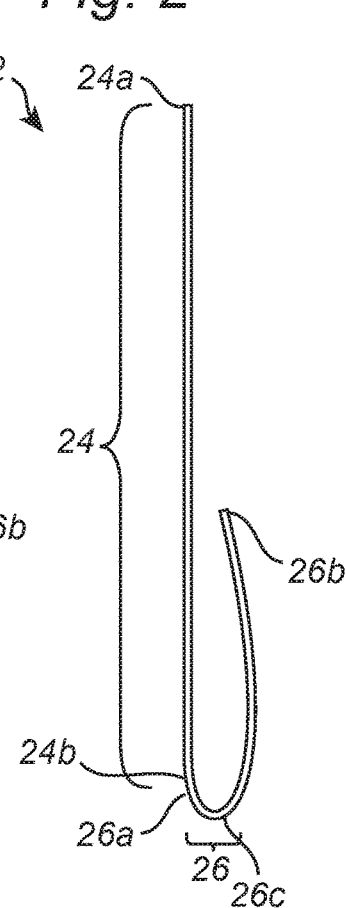

FIGS. 3a-c illustrate further variants of conductive pins 22. Similar to the conductive pin 22 of FIG. 2, the second portion 26b of the respective grip segment 26 of the conductive pins 22 is formed as a free end. The curved mid-segments 26c are however each formed with a radius of curvature in the order of the radius of the yarn or fibers allowing the grip segment 26 to be inserted through the textile 2 in a direction from first main surface 4 of the textile 2. A radius of curvature of the curved mid-segments 26c may depend on the design of the textile and the fibers, but may generally be in the range of 10 μm to 500 μm.

The conductive pins 22 of FIGS. 3a-c are similar but differ in that the second portion 26b is formed to be bent in a direction away from the leg segment 24, to extend in parallel with the leg segment 24, or to be bent in a direction toward the leg segment 24.

With reference to FIGS. 3a-c, each of the conductive pins 22 may accordingly be inserted with the grip segment 26 first, into the through-hole 18 from the side of the first main surface 14, and thereafter into the textile 2, through an aperture or loop in the textile 2. The conductive pin 22 may thereafter be pulled in the opposite direction wherein the grip segment 26 may pull one or more fibers 3, 8 towards, and even into, a lower opening portion of the through-hole 18. The grip segment may be pulled to such an extent that the second free end portion 26b becomes arranged inside the through-hole 18. Thereafter the through-hole 22 may be filled with a conductive material 30, as described in connection with FIG. 1c. The conductive pins 22 shown in FIG. 3a-c may accordingly engage with the fibers 3, 8 in a manner similar to a crocheting needle.

Figure 4:
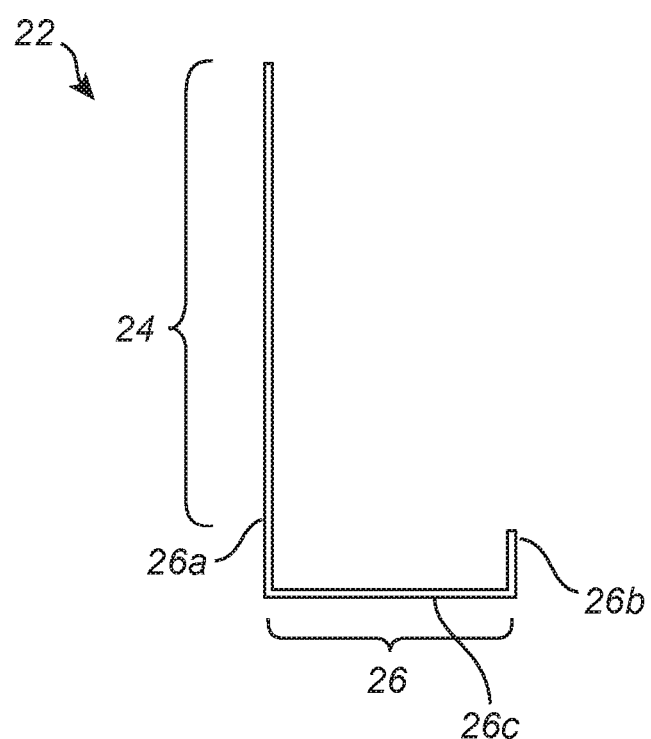

FIG. 4 illustrates yet another variation of a conductive pin 22. The pin 22 of FIG. 4 is similar to for instance the pin of FIG. 2 however differ by the grip segment 26 including two sharp bends. The grip segment 26 lacks a curved mid-portion. A straight first portion 26a and a straight second portion 26b extend from the mid-portion 26c, substantially perpendicular to the longitudinal direction of the mid-portion 26c.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For instance, although in the above an electronic circuit unit 10 in the form of a PCB has been described, the carrier 12 may alternatively be provided in the form a flexible substrate such as a plastic foil. The circuitry may be printed or otherwise formed on the flexible carrier. Additionally, although in FIGS. 1a-c, the first and second leg segments 24, 28 are shown to be segments of equal length, it is also possible to form the leg segments with slightly differing lengths.

The invention claimed is:
1. A system comprising:
 a conductive textile including conductive fibers;
 an electronic circuit unit arranged on a first main surface of the conductive textile and including circuitry and a carrier supporting the circuitry, the carrier having a first main surface and a second main surface, the second main surface facing the first main surface of the conductive textile, the carrier including a through-hole extending from the first main surface of the carrier to the second main surface of the carrier; and
 a conductive pin including a leg segment arranged at least partly in the through-hole, and a grip segment arranged to grip about at least one fiber of the conductive textile,
 wherein the leg segment forms a first leg segment and the conductive pin includes a second leg segment arranged at least partly in the through-hole, wherein the grip segment extends between and connects the first leg segment and the second leg segment, and
 wherein the first leg segment comprises a first portion being a free end portion of the conductive pin, and a second portion connected to the grip segment, and wherein the second leg segment comprises a first portion connected to the grip segment of the conductive pin, and a second portion being a free end portion.

2. The system according to claim 1, wherein the grip segment has a first portion connecting to the leg segment and a second portion extending towards the carrier.

3. The system according to claim 2, wherein the grip segment has a curved portion extending between the first portion and the second portion.

4. The system according to claim 3, wherein a radius of curvature of the curved portion is in the range of 10 μm to 500 μm.

5. The system according to claim 1, wherein at least a portion of the grip segment is in galvanic contact with a conductive fiber of the textile.

6. The system according to claim 1, wherein the electronic circuit unit includes a contact portion arranged on the carrier and the conductive pin is in galvanic contact with the contact portion.

7. The system according to claim 6, wherein the contact portion of the carrier is arranged on a sidewall surface of the through-hole.

8. The system according to claim 1, wherein the through-hole is at least partially filled with a conductive material.

9. The system according to claim 1, further comprising a wearable including the conductive textile.

10. The system according to claim 1, wherein the conductive textile includes a non-conductive textile and conductive fibers integrated in the non-conductive textile.

11. A method for mounting an electronic circuit unit on a conductive textile including conductive fibers, the method comprising:
   arranging the electronic circuit unit on a first main surface of the conductive textile, the electronic circuit unit including circuitry and a carrier supporting the circuitry, the carrier having first and second main surfaces and including a through-hole extending from the first main surface of the carrier to the second main surface of the carrier; and
   inserting a conductive pin into the through-hole and the textile,
      wherein the conductive pin comprises a leg segment and a grip segment,
      wherein the grip segment has a first portion connecting to the leg segment and a second portion extending towards the carrier, the second portion forming a free end of the grip segment, and
      wherein said inserting of the conductive pin comprises:
         inserting the conductive pin, with the grip segment first, into the through-hole and into the textile,
         wherein the grip segment of the conductive pin is arranged to grip about at least one conducting fiber of the textile and the leg segment of the conductive pin is inserted into the through-hole.

12. A method for mounting an electronic circuit unit on a conductive textile including a non-conductive textile and conductive fibers integrated in the non-conductive textile, the method comprising:
   arranging the electronic circuit unit on a first main surface of the conductive textile, the electronic circuit unit including circuitry and a carrier supporting the circuitry, the carrier having first and second main surfaces and including a through-hole extending from the first main surface to the second main surface; and
   inserting a conductive pin into the through-hole and the textile, wherein the conductive pin comprises a leg segment and a grip segment,
      wherein said inserting of the conductive pin comprises:
         inserting the conductive pin, with the grip segment first, into the through-hole and into the textile,
         wherein the grip segment of the conductive pin is arranged to bear against a circumferential portion of one or more fibers of the conductive textile, and is brought in galvanic contact with at least one conductive fiber of the conductive textile, and
         wherein the leg segment of the conductive pin is inserted into the through-hole.

\* \* \* \* \*